(12) United States Patent
Ohno

(10) Patent No.: US 8,993,438 B2
(45) Date of Patent: Mar. 31, 2015

(54) SEMICONDUCTOR DEVICE MANUFACTURING METHOD

(75) Inventor: Hiroshi Ohno, Yokohama (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 0 days.

(21) Appl. No.: 13/053,949

(22) Filed: Mar. 22, 2011

(65) Prior Publication Data

US 2012/0058638 A1 Mar. 8, 2012

(30) Foreign Application Priority Data

Sep. 8, 2010 (JP) ................. 2010-201409

(51) Int. Cl.
*H01L 21/28* (2006.01)
*H01L 21/268* (2006.01)
*H01L 21/324* (2006.01)

(52) U.S. Cl.
CPC .......... *H01L 21/2686* (2013.01); *H01L 21/324* (2013.01); *Y10S 977/89* (2013.01)
USPC .......................................... 438/666; 977/890

(58) Field of Classification Search
None
See application file for complete search history.

(56) References Cited

U.S. PATENT DOCUMENTS

| 2008/0214020 A1 | 9/2008 | Ito et al. | |
|---|---|---|---|
| 2009/0146310 A1 | 6/2009 | Ohno et al. | 257/773 |

FOREIGN PATENT DOCUMENTS

| JP | 5-53143 A | 3/1993 |
|---|---|---|
| JP | 9-107108 A | 4/1997 |
| JP | 2008-027988 A | 2/2008 |
| JP | 2008-066646 | 3/2008 |
| JP | 2008-192924 A | 8/2008 |
| JP | 2009-130243 A | 6/2009 |
| JP | 2009-141075 A | 6/2009 |

OTHER PUBLICATIONS

Japanese Office Action dated Jul. 17, 2012 from corresponding JP 2010-201409, 6 pages.
Taiwan Office Action, with English translation, dated Sep. 9, 2013 from corresponding Taiwan Patent Application No. 100131126, 12 pages.
Moharam, e al.; "Rigorous coupled-wave analysis of planar-grating diffraction"; J. Opt. Soc. Am., vol. 71, No. 7, Jul. 1981, pp. 811-818.
Ito, et al.; "10-15nm Ultrashallow Junction Formation by Flash-Lamp Annealing", Jpn. J. Appl. Phys.; vol. 41, Apr. 2002, Pt. 1, No. 4B; pp. 2394-2398.

*Primary Examiner* — Seahvosh Nikmanesh
(74) *Attorney, Agent, or Firm* — Ohlandt, Greeley, Ruggiero & Perle, L.L.P.

(57) ABSTRACT

According to one embodiment, a semiconductor device manufacturing method comprises defining a region in which absorptance of light illuminated for annealing to a substrate on which a pattern of a semiconductor integrated circuit is formed is not larger than a preset value as a coarse pattern region, locally forming a thin film that enhances light absorptance on the coarse pattern region, and annealing the substrate by illuminating light onto the substrate on which the pattern of the integrated circuit and thin film are formed.

12 Claims, 5 Drawing Sheets

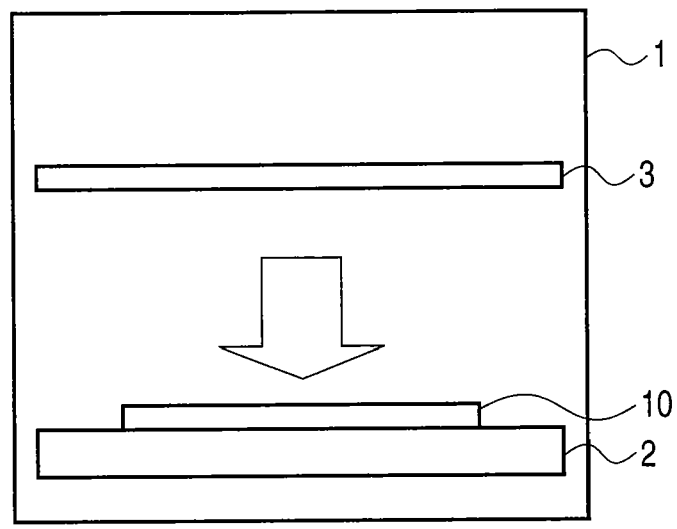
F I G. 1
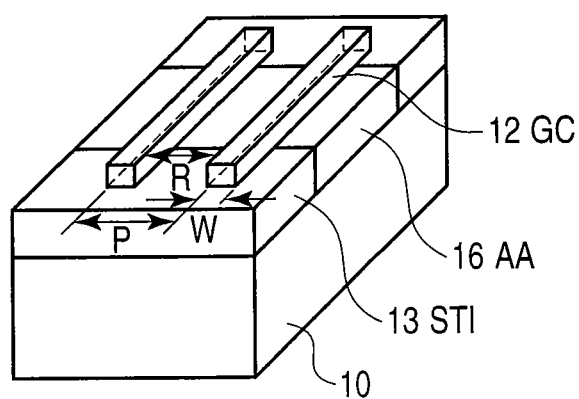
F I G. 2

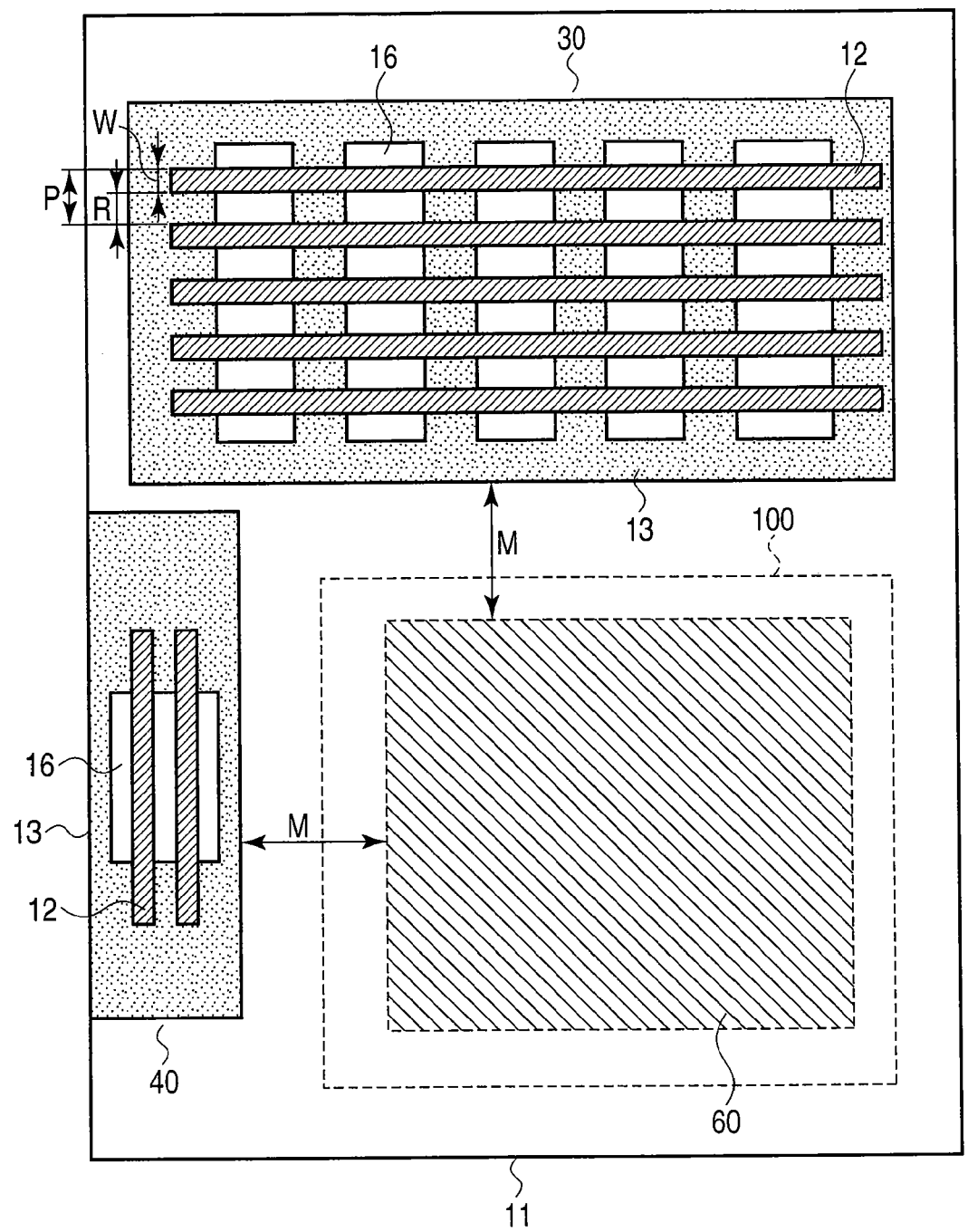
F I G. 3

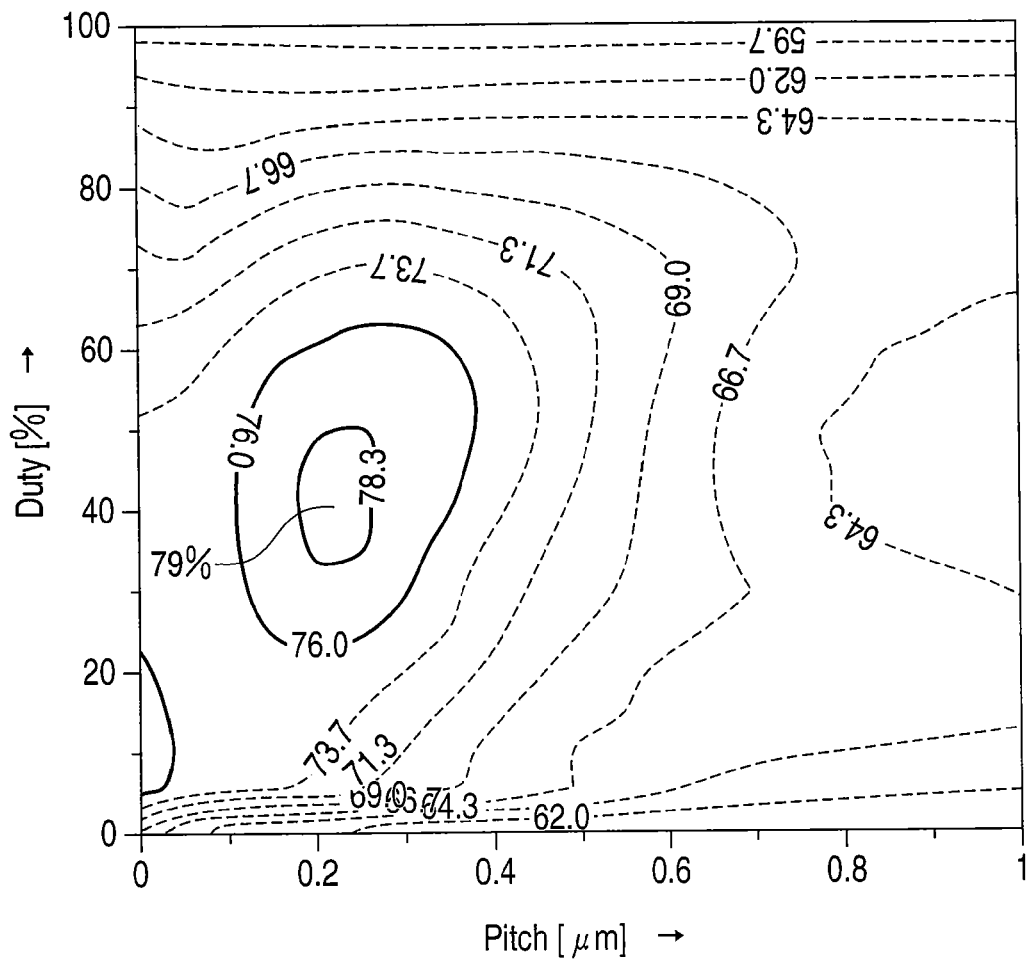
F I G. 4

SEMICONDUCTOR DEVICE MANUFACTURING METHOD

CROSS-REFERENCE TO RELATED APPLICATIONS

This application is based upon and claims the benefit of priority from Japanese Patent Application No. 2010-201409, filed Sep. 8, 2010; the entire contents of which are incorporated herein by reference.

FIELD

Embodiments described herein relate generally to a semiconductor device manufacturing method.

BACKGROUND

In order to set a semiconductor integrated circuit into an electrically active state, it is necessary to anneal a semiconductor substrate having an integrated circuit arranged on the surface thereof at temperatures of 1000° C. or more. With recent miniaturization of a integrated circuit, it is increasingly required to greatly reduce the anneal time in comparison with the conventional case. With this trend, the technique of optical annealing for electrically activating a miniaturized circuit by illuminating light of high intensity onto the substrate surface is proposed. For example, flash lamp annealing (FLA) and laser spike annealing (LSA) are provided as representatives.

With the optical annealing technique, the illumination time is shorter than that in the case of annealing of several seconds such as spike rapid thermal annealing (RTA) that is the conventional technique and annealing of milliseconds is realized. Even if the illumination time of illumination light is several milliseconds, the surface temperature of the semiconductor substrate can be instantly raised to a high temperature and only the surface layer portion of the substrate can be annealed.

However, in the above optical annealing technique, the thermal diffusion time becomes shorter because of short-time illumination. Therefore, there occurs a problem that a temperature irregularity of 10° C. or more tends to occur in the scale of approximately 100 μm that is the thermal diffusion length. Since the temperature irregularity causes a variation in the threshold voltage or the like in the chip, it is necessary to suppress the temperature irregularity as far as possible. In order to cope with this, the technique for controlling the initial heating temperature before optical annealing for each wafer region, the technique for arranging a large number of lamps and thermometers to adjust light intensity and the like are considered.

BRIEF DESCRIPTION OF THE DRAWINGS

FIG. 1 is a schematic configuration view showing a optical annealing apparatus used in a first embodiment.
FIG. 2 is a perspective view schematically showing the basic circuit structure of a semiconductor device.
FIG. 3 is a schematic view showing an example of the arrangement of various patterns formed on a semiconductor substrate, for illustrating a manufacturing method of a semiconductor device according to the first embodiment.
FIG. 4 is a diagram showing the relationship between light absorptance on the semiconductor substrate, nitride film thickness and circuit pattern pitch.

DETAILED DESCRIPTION

Figure 5:
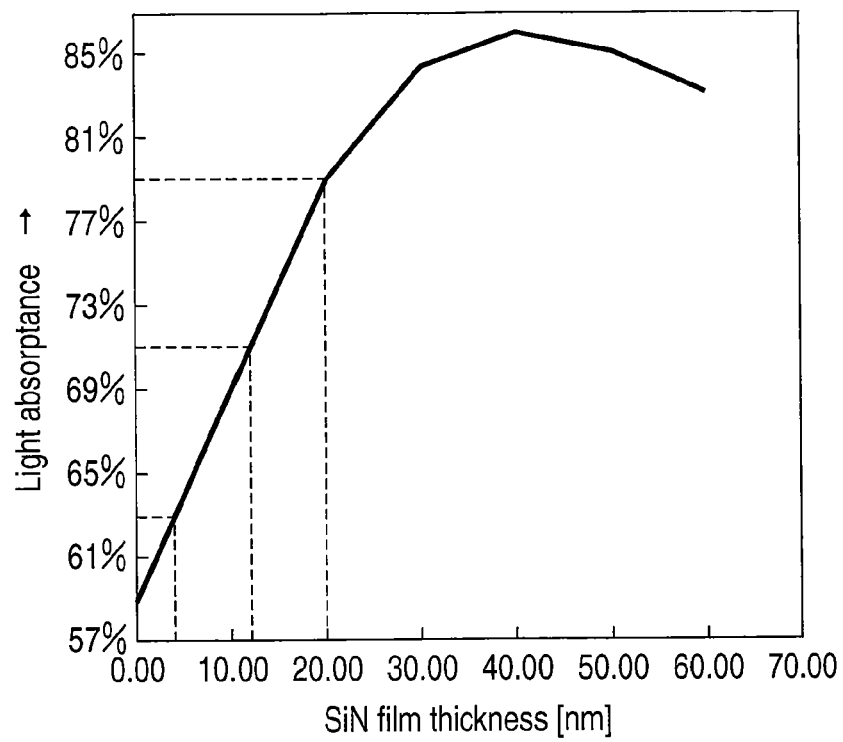
FIG. 5 is a diagram showing the relationship between light absorptance on the semiconductor substrate and nitride film thickness.

In general, according to one embodiment, a semiconductor device manufacturing method comprises defining a region in which absorptance of light illuminated for annealing to a substrate on which a pattern of a semiconductor integrated circuit is formed is not larger than a preset value as a coarse pattern region, locally forming a thin film that enhances light absorptance on the coarse pattern region, and annealing the substrate by illuminating light onto the substrate on which the pattern of the integrated circuit and thin film are formed.

Next, embodiments are explained with reference to the drawings.

First Embodiment

FIG. 1 is a schematic configuration view showing a optical annealing apparatus used in a first embodiment. In a chamber 1, a susceptor 2 on which a semiconductor substrate 10 is placed and a light source 3 that illuminates light onto the surface of the substrate 10 are arranged. The illumination time of illumination light by the light source 3 is several milliseconds or less and the surface temperature of the semiconductor substrate 10 instantly reaches a high temperature to anneal only the surface layer portion.

For example, the light source 3 is formed of a xenon lamp or another lamp having substantially the same intensity spectrum as a xenon lamp. The xenon lamp has an intensity spectrum between 6000K and 7000K at a temperature of black body radiation. At this time, the wavelength is λ (for example, 450 nm). Further, the illumination time is set to several ms and does not exceed one second.

In this embodiment, a nitride film, for example, a silicon nitride film is formed on a region in which light absorptance is low in the semiconductor substrate 10 at the time of a optical annealing step. The region in which light absorptance is low is defined as a coarse pattern region and a region in which light absorptance is high is defined as a dense pattern region.

The circuit structure of the semiconductor device has the basic structure as shown in FIG. 2 and is configured by gate conductors (GCs) 12, shallow trench isolation (STI) region 13 and active area (AA) 16 formed on the semiconductor substrate 10 formed of silicon or the like. The dimensions of the respective portions are variously set, and therefore, the shape of the circuit pattern becomes complicated as a whole, but the basic structure shown here is provided. In this case, the CG 12 is formed of silicon or polysilicon. However, the material is not limited to this and any material having the same refraction index as that of silicon or polysilicon can be used. Further, the AA 16 is a region in which an impurity is contained in the silicon substrate 10. The impurity is boron or phosphorus. Of course, the impurity is not limited to these elements.

In a region in which two or more GCs 12 are provided, four combinations of sides that are parallel to one another and are separated with a preset distance between the adjacent two GCs 12 are provided, the distance is defined as pitch P. Further, the closest distance between the GCs 12 is set to R. In this case, closest distance R is a distance that makes the distance between A and B closest when points in the respective regions of the two adjacent GCs 12 are set to A and B.

In a general circuit structure, AAs 16 are often densely arranged. However, the closest distance between the two adjacent AAs 16 will not become smaller than closest distance R between the GCs 12 disposed in contact with the AAs 16. In this case, the closest distance between the AAs 16 is a distance that makes the distance between A and B closest when points in the respective regions of the two adjacent AAs 16 are set to A and B. It is considered below that the closest distance between the AAs 16 is larger than closest distance R between the GCs 12.

In the model described above, a region in which GCs with pitch P set in a range of 10 nm to 0.5 μm exist when closest distance R of the GC 12 is set in a range of 10 nm to 0.5 μm, GC width W is set in a range of 10 nm to 0.5 μm and pitch P can be defined is referred to as a dense pattern region. Further, a region in which an STI region 13 exists is referred to as a dense pattern region. Note that the pitch P, width R, and closest distance R of GCs or AAs are assumed not to be set in a range of less than 10 nm.

A coarse pattern region is a region in which the dense pattern does not exist. Further, a circuit pattern in the coarse pattern region is referred to as a coarse pattern. In the coarse pattern region, a region in which none of the GC 12, STI 13, AA 16 exists is included. For example, a region in which the substrate surface is exposed is also a coarse pattern region.

FIG. 3 shows an example of the arrangement of various patterns formed on the semiconductor substrate 10.

In FIG. 3, a semiconductor integrated circuit configured by semiconductor circuit patterns 30, 40 is arranged on the main surface 11 of the semiconductor substrate. The main surface 11 of the semiconductor substrate is subjected to a optical annealing process such as an FLA process. The circuit patterns 30, 40 are configured by the GCs 12, STI regions 13 and AAs 16. In a desired one of the GCs 12, pitch P is 0.1 μm and is set in a range of 0.01 μm to 0.5 μm. GC width W is 0.05 μm and is set in a range of 0.01 μm to 0.5 μm. Closest distance R of the GC is 0.05 μm and is set in a range of 0.01 μm to 0.5 μm.

The region in which the GCs 12 are arranged and the region in which the STI 13 is arranged are dense pattern regions. Further, a coarse pattern region 100 is a portion in which the surface of the silicon substrate 10 is exposed and none of the GC 12, STI 13 and AA 16 is arranged. In this region, a silicon nitride film 60 with a thickness of 12 nm is formed. It is assumed that margins M of the nitride film 60 and STI 13 are set to 100 μm or less. The distance is not larger than the thermal diffusion length at the FLA time.

Under the above condition, the semiconductor substrate main surface 11 is subjected to the FLA process. The FLA process is performed for one millisecond and the temperature of the semiconductor substrate main surface 11 is set at 1200° C. during the FLA process.

When the silicon nitride film 60 is formed, an oxide film, for example, a silicon oxide film may be sandwiched between the nitride film 60 and the silicon substrate 10. If the oxide film is sandwiched, it is advantageous because the insulation property of the substrate surface can be kept when the nitride film 60 is separated and interconnection lines are formed after annealing. The thickness of the oxide film may be set sufficiently smaller than λ/4n in a range in which the reflection characteristic can be kept unchanged even if the oxide film is formed when the peak wavelength of illumination light is λ and the refraction index of the material is n.

Next, the operation and effect of this embodiment are explained.

FIG. 4 shows the calculation results of light absorptance when various dimensions are assumed for pattern pitch P and duty ratio (the ratio of GC width W to pitch P) of the GC 12. The calculation is based on Rigorous Coupled Wave Analysis (RCWA) (M. G. Moharam, T. K. Gaylord, "Rigorous coupled-wave analysis of planar-grating diffraction", J. Opt. Soc. Am., Vol. 71, No. 7, 1981). In the drawing, the abscissa indicates a pattern pitch, the ordinate indicates a duty ratio and contour lines indicate light absorptance.

It is assumed that pattern pitch P of the GC 12 is set in a range of 0.01 μm to 0.5 μm, GC width W is set in a range of 0.01 μm to 0.5 μm and closest distance R of the GC is set in a range of 0.01 μm to 0.5 μm. At this time, pitch P is set to 0.02 μm (0.01 μm+0.01 μm) that is the smallest value and GC width W is set to 0.01 μm. Further, when pitch P is set to 0.1 μm, GC width W is set in a range of 0.01 μm to 0.09 μm, which satisfies the condition that the closest distance R should be more than 0.01 μm. With the above limitation, the light absorptance is set in a range of approximately 63% to 79% as is understood from FIG. 4.

That is, when pitch P is 0.2 μm and the duty ratio is 40%, GC width W becomes 0.08 μm and closest distance R of the GC becomes 0.12 μm. In this case, the light absorptance is set to the maximum value of 79%. Further the light absorptance when the duty ratio is set to 90% is set to the minimum value of 63% irrespective of the magnitude of pitch P. For example, when pitch P is set to 0.2 μm and the duty ratio is 90%, GC width W becomes 0.18 μm and closest distance R of the GC becomes 0.02 μm. In this case, the light absorptance is set to the minimum value of 63%. Therefore, the light absorptance in the dense pattern region is set in a range of approximately 63% to 79% as shown in FIG. 3.

Further, the light absorptance of the silicon substrate 10 is approximately 58%. This value is derived by the calculation based on RCWA. In FIG. 3, the light absorptance of the coarse pattern region 100 is equal to the light absorptance of the silicon substrate 10 and is set to approximately 58% when a nitride film 60 is not formed. Further, the light absorptance of the STI region 13 is approximately 70%. This value is also derived by the calculation based on RCWA.

Based on the above operations, the light absorptance difference between the dense pattern region (circuit patterns 30, 40) and the coarse pattern region 100 is set in a range of 5% to 21%. That is, the maximum variation width of the light absorptance difference between the coarse pattern region 100 and the dense pattern region is set to 21%. When the anneal temperature is set to 1200° C., a temperature difference caused by the light absorptance difference becomes 252° C. at most. Such a large temperature difference influences the basic characteristics, such as a threshold voltage and resistance of the circuit. That is, if a large temperature difference occurs in the substrate surface at the annealing time, a variation occurs in the basic characteristics, leading to degradation in the circuit quality.

The light absorptance of the dense pattern region varies from 63% to 79% and the intermediate value is 71%. When the light absorptance of the coarse pattern region 100 is set to the intermediate value, the maximum difference between the coarse pattern region 100 and the dense pattern region becomes minimum and the maximum difference becomes 8%. Further, the light absorptance of the coarse pattern region 100 varies according to the film thickness of the nitride film 60 formed on the coarse pattern region 100.

In practice, the relationship between the film thickness of the silicon nitride film and the light absorptance is set as shown in FIG. 5. The abscissa in the drawing indicates the film thickness and the ordinate indicates the light absorptance. The drawing shows the calculation result based on RCWA. As is understood from the drawing, the maximum light absorptance difference between the coarse pattern region 100 and the dense pattern region can be made minimum by forming the nitride film 60 with the film thickness of 12 nm. In this embodiment, the film thickness is 12 nm and the maximum light absorptance difference between the coarse pattern region 100 and the dense pattern region is set to the minimum value of 8%. However, the maximum difference between the light absorptances in the dense pattern region becomes 16%.

If the film thickness of the nitride film 60 is increased from 4 nm to 20 nm, the light absorptance in the coarse pattern region 100 is increased from 63% to 79%. As described before, the light absorptance in the dense pattern region ranges from approximately 63% to 79%. Therefore, if the film thickness of the nitride film 60 is set within this range, the variation ranges of the light absorptances of the coarse pattern region 100 and dense pattern region become equal to each other. At this time, the maximum difference between the light absorptances in the two regions of the coarse pattern region 100 and the dense pattern region can be made minimum.

Figure 6:
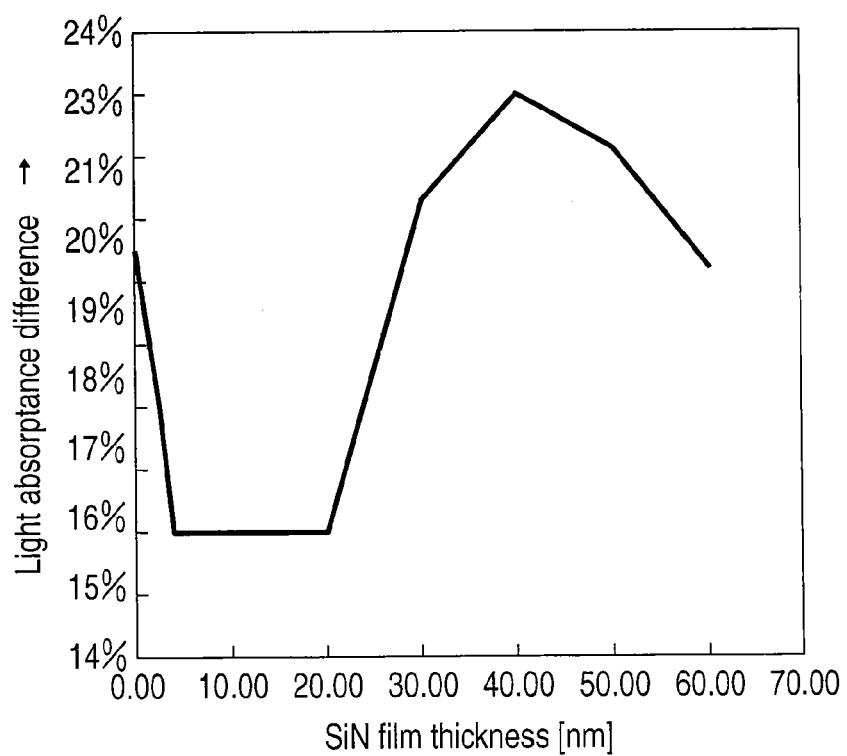
FIG. 6 is a diagram showing the relationship between light absorptance difference on the semiconductor substrate and nitride film thickness.

In practice, the relationship between the light absorptance difference and the film thickness is shown in FIG. 6. The abscissa indicates the film thickness of the nitride film 60 and the ordinate indicates the maximum difference between the light absorptances in the two regions of the coarse pattern region 100 and the dense pattern region. It is understood from FIG. 6 that the maximum light absorptance difference is set minimum when the film thickness is set in a range of 4 nm to 20 nm. In this embodiment, the film thickness is 12 nm and the maximum light absorptance difference is set to the minimum value of 16%.

As described above, it is understood that the maximum difference between the light absorptances in the two regions of the coarse pattern region 100 and the dense pattern region can be made minimum if the film thickness of the nitride film 60 formed on the coarse pattern region 100 is set in a range of 4 nm to 20 nm.

Thus, according to this embodiment, the light absorptance can be made uniform as a whole by arranging the nitride film 60 used to enhance the light absorptance in the coarse pattern region 100 whose light absorptance is low and temperature irregularity can be reduced. As a result, temperature irregularity in the substrate surface can be reduced and the circuit performance can be prevented from being degraded. That is, circuit degradation caused by temperature irregularity occurring in the semiconductor integrated circuit at the optical annealing time can be prevented without performing the fine adjustment and improvement on the light source side and this can contribute to enhancement of the performance of the semiconductor integrated circuit.

In this embodiment, the nitride film 60 is formed directly on the semiconductor substrate main surface 11, but a thin silicon oxide film of several nm may be sandwiched between the substrate main surface 11 and the nitride film 60. In this case, variation in the light absorptance accompanied by formation of the oxide film is less and the operation is not influenced.

Second Embodiment

Figure 7:
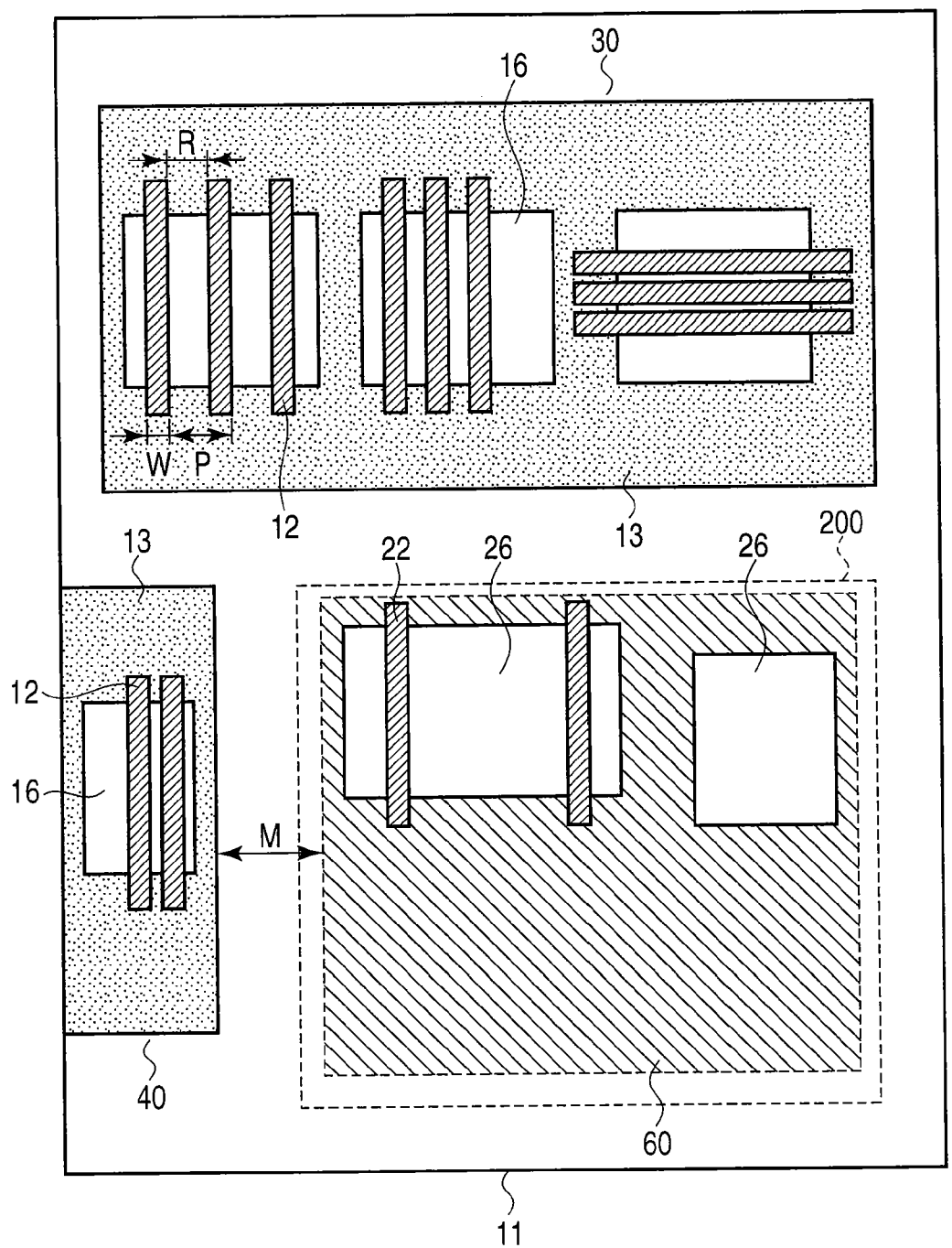
FIG. 7 is a schematic view showing an example of the arrangement of various patterns formed on a semiconductor substrate, for illustrating a manufacturing method of a semiconductor device according to a second embodiment.

FIG. 7 is a schematic view showing an example of the arrangement of various patterns formed on a semiconductor substrate, for illustrating a manufacturing method of a semiconductor device according to a second embodiment. A optical annealing apparatus used in this embodiment is the same as that of FIG. 1.

Like the arrangement of FIG. 3, circuit patterns 30, 40 configured by CGs 12, STI regions 13, and AAs 16 are formed on a semiconductor substrate main surface 11. In this case, in a desired one of the CGs 12, pitch P is 0.1 μm and is set in a range of 0.01 μm to 0.5 μm. GC width W is 0.05 μm and is set in a range of 0.01 μm to 0.5 μm. Closest distance R of the GC is 0.05 μm and is set in a range of 0.01 μm to 0.5 μm. A region in which the GCs 12 are arranged and a region in which the STI region 13 is arranged are dense pattern regions.

Further, in a coarse pattern region 200, a circuit pattern 50 formed of GCs 22 and AAs 26 is provided. However, the closest distance between the GCs 22 of the circuit pattern 50 is set to 0.6 μm and the GCs 22 are classified into a coarse pattern. The AA 26 contains an impurity in the silicon substrate. In this case, the refraction index of the AA 26 in the wavelength range of FLA is the same as that of the silicon substrate. In a region of the coarse pattern region 200, a silicon nitride film 60 with a thickness of 12 nm is formed. In this case, the film is not formed on the GC 22 and is formed on the AA 26.

It is assumed that margins M of the nitride film 60 and STI 13 are set to 100 μm or less. The distance is not larger than the thermal diffusion length at the FLA time. Further, generally, GC width W of the GC 22 does not exceed 1 μm. Therefore, the temperature in the region of the GC 22 is made uniform at the FLA time. The semiconductor substrate main surface 11 is subjected to an FLA process in this state. The FLA process is performed for one millisecond and the temperature of the semiconductor substrate main surface 11 becomes 1200° C. during the process.

Next, the operation and effect of this embodiment are explained.

Like the first embodiment, it is assumed that the light absorptance of the dense pattern region changes from 63% to 79%.

Since the coarse pattern region 200 is a region other than the dense pattern region, the light absorptance of the coarse pattern region 200 becomes 71% or less as shown in FIG. 4 when the pitch P is slightly above 0.5 μm. Further, the lower limit is set equal to the light absorptance of the silicon substrate 10 and is 58%. That is, the light absorptance of the coarse pattern region 200 is set in a range of 58% to 71%. The variation width is 13%. At this time, it is considered that the light absorptance is increased by 13% at maximum by the presence of the coarse pattern of the GCs 22 in comparison with the structure having the nitride film 60 formed directly on the semiconductor substrate main surface 11.

Therefore, when considering the film thickness range of 4 nm to 20 nm like the first embodiment, the light absorptance of the coarse pattern region 200 becomes 63% to 75% at most when the film thickness is 4 nm and 79% to 92% at most when the film thickness is 20 nm. As described above, the light absorptance in the dense pattern region ranges from approximately 63% to 79%. At this time, if the film thickness is 20 nm, the light absorptance of the coarse pattern region 200 may sometimes become larger than that of the dense pattern region by +13% at maximum. If the film thickness is set in a range of 4 nm to 8 nm, the light absorptance of the coarse pattern region 200 becomes approximately 63% to 79% as shown in FIG. 5 and coincides with the light absorptance of the dense pattern region.

As described above, if the film thickness of the nitride film 60 formed on the coarse pattern region 200 is set in a range of 4 nm to 8 nm, the maximum difference between the light absorptances in the two regions of the coarse pattern region 200 and the dense pattern region can be made minimum.

Thus, according to this embodiment, the light absorptances of the dense pattern region and coarse pattern region 200 can be set close to each other by forming the nitride film 60 not only on the coarse pattern region 100 on which none of the GC, AA, STI is formed but also on the coarse pattern region 200 on which the GCs and AAs are formed, the density of the GCs is low and the light absorptance is low. Therefore, the same effect as that of the first embodiment can be attained.

In the above explanation, an example in which the nitride film 60 is not formed on the GCs 22 is explained, but the nitride film 60 may be formed on the GCs 22. Since the GC width of the GC 22 is 1 µm or less and the GCs are scattered on the semiconductor substrate main surface 11, variation in the light absorptance of the GCs 22 formed can be neglected.

(Modification)

This invention is not limited to the above embodiments. The optical annealing apparatus is not limited to the structure shown in FIG. 1 and any type of apparatus can be used if optical annealing in the millisecond unit can be realized. Further, the annealing method is not limited to FLA and LSA can be used.

Further, a thin film formed on the coarse pattern region is not limited to the silicon nitride film and an insulating film having a light absorptance higher than that of the substrate can be used. The arrangement of the patterns shown in FIG. 3 and FIG. 7 is only one example and various patterns can of course be applied.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device manufacturing method comprising:
   preparing a substrate that comprises a course pattern region in which absorptance of light illuminated for annealing the substrate on which a pattern of a semiconductor integrated circuit is formed is not higher than a preset value,
   locally forming a thin film that enhances light absorptance on the coarse pattern region, and
   annealing the substrate by illuminating light onto the substrate on which the pattern of the integrated circuit and thin film are formed, wherein the thin film is a silicon nitride film, and wherein the thin film has a film thickness set between 4 nm and 20 nm when a gate pattern is not contained in the coarse pattern region.

2. The method according to claim 1, wherein a xenon lamp is used as a light source for the illumination light.

3. The method according to claim 1, wherein an insulating film having a light absorptance higher than that of the substrate is used as the thin film.

4. The method according to claim 1, wherein a silicon oxide film is inserted between the surface of the substrate and the thin film.

5. The method according to claim 1, wherein the coarse pattern region is a region in which neither of a gate pattern and an element isolation insulating film is formed.

6. The method according to claim 1, wherein the coarse pattern region is a region in which an element isolation insulating film is not formed, gate patterns are formed and a closest distance between the gate patterns is larger than 0.5 µm.

7. The method according to claim 1, wherein the gate pattern is formed of one of silicon and polysilicon.

8. A semiconductor device manufacturing method comprising:
   preparing a substrate that comprises a coarse pattern region and one of a dense pattern region in which a closest distance between gate patterns is not larger than 0.5 µm and a region in which an element isolation insulating film is formed on the substrate on which a pattern of a semiconductor integrated circuit is formed as a dense pattern region,
   locally forming a thin film that enhances light absorptance on the coarse pattern region, and
   annealing the substrate by illuminating light onto the substrate on which the integrated circuit pattern and thin film are formed, wherein the thin film is a silicon nitride film, and wherein the thin film has a film thickness set between 4 nm and 20 nm when a gate pattern is not contained in the coarse pattern region.

9. The method according to claim 8, wherein a xenon lamp is used as a light source for the illumination light.

10. The method according to claim 8, wherein an insulating film having a light absorptance higher than that of the substrate is used as the thin film.

11. The method according to claim 8, wherein a silicon oxide film is inserted between the surface of the substrate and the thin film.

12. The method according to claim 8, wherein the gate pattern is formed of one of silicon and polysilicon.

* * * * *